(12) United States Patent
Altfeld et al.

(10) Patent No.: US 7,007,260 B2
(45) Date of Patent: Feb. 28, 2006

(54) METHOD FOR FABRICATING AN INTEGRATED SEMICONDUCTOR CIRCUIT

(75) Inventors: Helge Altfeld, München (DE); Monika Gschöderer, München (DE); Michael Eisenhut, München (DE); Marc Walter, München (DE); Beate Frankowsky, Höhenkirchen-Siegerstbrunn (DE)

(73) Assignee: Infineon Technologies AG, Munich (DE)

( * ) Notice: Subject to any disclaimer, the term of this patent is extended or adjusted under 35 U.S.C. 154(b) by 42 days.

(21) Appl. No.: 10/273,524

(22) Filed: Oct. 18, 2002

(65) Prior Publication Data

US 2003/0079196 A1    Apr. 24, 2003

(30) Foreign Application Priority Data

Oct. 18, 2001    (DE) .................................. 101 51 379

(51) Int. Cl.
*G06F 17/50*    (2006.01)

(52) U.S. Cl. .................... 716/11; 716/8; 716/9; 716/10
(58) Field of Classification Search .................... 716/5, 716/8–11; 715/504; 703/14–16, 22; 326/39–41; 382/145

See application file for complete search history.

(56) References Cited

U.S. PATENT DOCUMENTS

| | | | |
|---|---|---|---|
| 5,212,107 A | 5/1993 | Suzuki et al. | |
| 5,483,461 A * | 1/1996 | Lee et al. | 716/14 |
| 5,694,481 A * | 12/1997 | Lam et al. | 382/145 |
| 5,696,693 A * | 12/1997 | Aubel et al. | 716/8 |
| 5,910,733 A * | 6/1999 | Bertolet et al. | 326/41 |
| 5,952,684 A | 9/1999 | Tashiro | |
| 6,091,090 A * | 7/2000 | Gheewala | 257/211 |
| 6,173,246 B1 * | 1/2001 | Billups, III | 703/22 |
| 6,260,177 B1 * | 7/2001 | Lee et al. | 716/2 |
| 6,308,309 B1 * | 10/2001 | Gan et al. | 716/8 |
| 6,467,074 B1 * | 10/2002 | Katsioulas et al. | 716/17 |
| 6,523,162 B1 * | 2/2003 | Agrawal et al. | 716/19 |
| 6,782,524 B1 * | 8/2004 | Rittman | 716/19 |
| 2002/0023107 A1 * | 2/2002 | Gont et al. | 707/504 |
| 2003/0061583 A1 * | 3/2003 | Malhotra | 716/5 |

FOREIGN PATENT DOCUMENTS

| | | |
|---|---|---|
| DE | 41 32 849 C2 | 4/1992 |
| DE | 100 04 599 A1 | 10/2000 |

* cited by examiner

*Primary Examiner*—Matthew Smith
*Assistant Examiner*—Naum Levin
(74) *Attorney, Agent, or Firm*—Laurence A. Greenberg; Werner H. Stemer; Ralph E. Locher

(57) ABSTRACT

A method for fabricating an integrated semiconductor circuit having at least two different wiring forms realized in a same metallization plane includes drawing each of the different wiring forms on respectively different layer types. In this manner, the at least two different wiring forms can be individually and jointly analyzed.

5 Claims, 2 Drawing Sheets

| Metal Plane | Automatic Wiring Tool | Manual Wiring | LAYER TYP (GDS) | LAYER TYP (df II) | Wiring FORM |
|---|---|---|---|---|---|
| $M_1$ | PAR | — | 8 | PAR | 1 |
| $M_1$ | — | Macro | 0 | drawing | 2 |
| $M_2$ | PAR | — | 28 | | 1 |
| $M_2$ | — | Macro | 10 | | 2 |
| $M_3$ | PAR | — | 31 | | 1 |
| $M_3$ | — | Macro | 2 | | 2 |

| Metal Plane | Automatic Wiring Tool | Manual Wiring | LAYER TYP (GDS) | LAYER TYP (df II) | Wiring FORM (FIG. 1) |
|---|---|---|---|---|---|
| $M_1$ | PAR | — | 8 | PAR | 1 |
| $M_1$ | — | Macro | 0 | drawing | 2 |
| $M_2$ | PAR | — | 28 | | 1 |
| $M_2$ | — | Macro | 10 | | 2 |
| $M_3$ | PAR | — | 31 | | 1 |
| $M_3$ | — | Macro | 2 | | 2 |

METHOD FOR FABRICATING AN INTEGRATED SEMICONDUCTOR CIRCUIT

BACKGROUND OF THE INVENTION

Field of the Invention

The invention relates to a method for fabricating an integrated semiconductor circuit in which at least two different wiring forms are realized in the same metallization plane.

During the semiautomatic creation of the physical circuit design of integrated semiconductor circuits, a distinction is generally made between a plurality of wiring forms in the same metallization plane. A wiring form of this type is a short-range wiring, which for the most part is produced by manual layout. The short-range wiring essentially relates to wirings between individual components within a functional unit, while the wide-range wiring essentially contains signal and supply lines over a plurality of function blocks. The wide-range wiring is predominantly performed by automatic wiring tools.

In the fabrication of integrated semiconductor circuits, a layout is understood as either the drawn physical image of the shaping of integrated circuits and their mutual wirings or the operation of drawing or generating the same. A plane, for example a metallization plane, of such a layout is understood as the drawing representation of a physical active layer in an integrated circuit, such as, for example, an aluminum wiring plane, an implantation region, a well with majority charge accumulation and so on. In the context of the instant application, the wiring within the metallization planes is the center of attention.

Both the capabilities of a manual layout and an automatically created wiring differ, and so do the demands on wide-range wiring and short-range wiring. If, as assumed, wide-range wiring and short-range wiring occur on the same metal plane, then for layout checks (design rule checks (DRC)) and automatic layout manipulations the need arises to distinguish between the two wiring forms, that is to say the problem generally arises as to how the two wiring forms can be distinguished.

SUMMARY OF THE INVENTION

It is accordingly an object of the invention to provide a method for fabricating an integrated semiconductor circuit which overcomes the above-mentioned disadvantages of the prior art methods of this general type, in which at least two different wiring forms are realized in the same metallization plane in such a way that the different wiring forms can be automatically distinguished for layout checks and automatic layout manipulations.

With the foregoing and other objects in view there is provided, in accordance with the invention, a method for fabricating an integrated semiconductor circuit having at least two different wiring forms realized in a same metallization plane. The method includes drawing each of the different wiring forms as respectively different layer types.

In accordance with one aspect, the principle of the present method for achieving the above object is that each of the different wiring forms of a respective metallization plane is drawn on a respectively different layer type.

Since nowadays the layout creation is performed in a computer and the created layout is stored in a computer memory, it is possible, in accordance with the method according to the invention, to assign to the respective layer type, which represents a purely software-related subdivision before the beginning of the design, a specific data format for the storage of the drawn layout in each case for the short-range wiring and the wide-range wiring. In this way, it is possible to separately access the drawn layouts in the corresponding wiring form in the computer memory, so that an "optical proximity correction" (OPC) performed during fabrication or the already mentioned method for automatically checking technological specifications for the physical chip design, by a design rule check (DRC), can be performed in accordance with each wiring form or each layer type defined therefore. OPC and DRC are only examples of general activities in chip design, such as "checking" and "manipulation".

Stated in simplified terms, the above-mentioned OPC alters drawn forms in order to achieve better producibility, and, in the special instance of OPC called "manufacturing OPC", the drawn form is first brought by widening to an order of magnitude for which a process window exists.

One application of the method according to the invention is characterized in that the manufacturing OPC is carried out with in each case specific values (e.g. relating to the width and/or spacing of the interconnects) depending on the respectively defined layer type.

A further application of the method according to the invention in the automatic checking of technological specifications for the physical chip design by software by DRC is characterized in that the DRC is carried out with in each case specific values depending on the respectively defined layer type.

In accordance with an added mode of the invention, there is the step of distinguishing the two different wiring forms as a short-range wiring form and a wide-range wiring form that can be automatically identified in a drawing as the respectively different layer types. The wide-range wiring form substantially contains wirings for signal and supply lines for a plurality of function blocks, and the short-range wiring form substantially contains wirings of individual components within a function block. The wide-range wiring form is drawn using an automatic wiring tool, and the short-range wiring form based is drawing on a macro level and largely manually.

In accordance with another mode of the invention, there are the steps of allocating a first minor layer type to the wide-range wiring form on the metallization plane, and allocating a second minor layer type to the short-range wiring form on the metallization plane in macros.

In accordance with an additional mode of the invention, there is the step of storing the respectively different layer types in a computer in respectively assigned different data formats.

In accordance with a further mode of the invention, there is the step of automatically manipulating structures stored as data during a chip design by carrying out a manipulation for the wide-range wiring form and the short-range wiring form with in each case specific values depending on the respectively defined layer types.

In accordance with a concomitant feature of the invention, there is the step of automatically checking technological specifications for a physical chip design using software by checking structures stored as data for the short-range wiring form and for the wide-range wiring form with in each case specific values depending on the respectively defined layer types.

Other features which are considered as characteristic for the invention are set forth in the appended claims.

Although the invention is illustrated and described herein as embodied in a method for fabricating an integrated semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figures 1, 2:
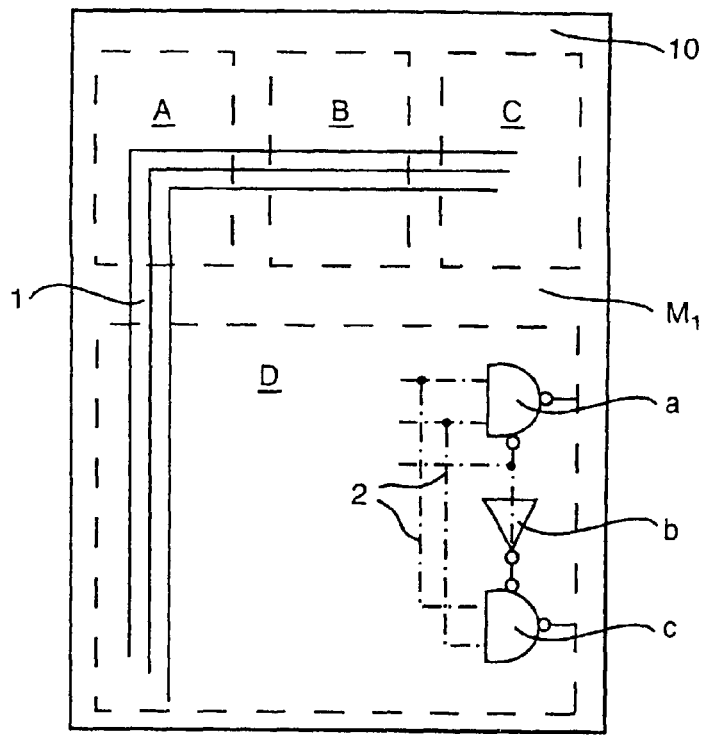
FIG. 1 is a diagrammatic, partial plan view and partial circuit diagram of a circuit and metallization structures of different forms in a specific metallization plane.
FIG. 2 is a table showing an exemplary assignment of different layer types in accordance with the different wiring forms of FIG. 1.

Referring now to the figures of the drawing in detail and first, particularly, to FIG. 1 thereof, there is shown by way of example a diagrammatic plan view of a metallization plane M1 of an integrated semiconductor circuit 10. A plurality of function blocks A, B, C and D are indicated by way of example by singularly dashed lines. The function blocks are interconnected in the plane M1 by wide-range wiring 1, which represents a first wiring form in the metallization plane M1.

In the function block D, a plurality of logic components a, b and c are depicted by way of example and greatly enlarged, which logic components are connected in the metallization plane M1 by short-range wiring 2 depicted by dashed-dotted lines, the short-range wiring representing a second wiring form.

As mentioned, the object consists, then, in making the two wiring forms 1 and 2 in the layout distinguishable from one another in particular for layout checks and automatic layout manipulations.

The invention therefore proposes that each of the different wiring forms 1, 2 of the respective metallization plane, that is to say e.g. the metallization plane M1 in FIG. 1, be drawn on a respectively different layer type. In this case, the layer type performs a purely software-related subdivision of the different wiring forms before the beginning of the circuit design. Whereas conventionally both wiring forms in a metallization plane were drawn on the same layer type, now the wide-range wiring is generated on a layer of a different type than the short-range wiring.

Thus, the two wiring forms can be distinguished during layout checks and automatic layout manipulations and different parameters (e.g. relating to the width of the respective metal lines) can be allocated to both forms for the checks and manipulations.

FIG. 2 shows in tabular form an exemplary assignment of different layer types in accordance with the wiring forms 1 and 2 according to FIG. 1. In FIG. 2 the left-hand column designates a respective metallization plane M1, M2, M3, and the second and third columns from the left designate a respective wiring form 1 (PAR) and 2 (Macro). PAR is an abbreviation of "place & route", which represents an automatic wiring tool, and Macro designates a wiring that is performed manually, in principal, with the aid of macros that can be called up in the computer. The fourth and fifth columns in FIG. 2 contain different layer types allocated to the different wiring forms 1 and 2, to be precise in each case in the GDS data format, which is a standardized data format for storing graphical data of the physical circuit design, and in the dfII data format, which is a data format for storing graphical data of the physical circuit design from the software company CADENCE. In the GDS data format, the wiring form 1 of the plane M1 acquires a layer type 8 and the wiring form 2 of the plane M2 the layer type 0. Consequently, in M1 all wirings that are produced by an automatic wiring tool (and also wirings in the standard cells) acquire the minor layer type 8 in the GDS format. The wirings in the form 2, which are principally created manually by the macros, acquire the minor layer type 0 in the GDS format. As a result, for the automatic and standard cell wiring, it is possible to use different values for design rule check and manufacturing OPC than for the wiring in the macros. Equally, in M1, in accordance with the fifth column from the left in the dfII format, the wiring form 1 acquires the layer type PAR and the wiring form 2 to the layer type Drawing. Further examples of layer types allocated to the respective wiring forms 1 and 2 are specified for the GDS format in the fourth column from the left in FIG. 2 for metallization planes M2 and M3.

It goes without saying that the layer types entered in the table of FIG. 2 are merely by way of example and do not constitute any restriction of the method according to the invention.

The advantage of the different allocation of different layer types for the different wiring forms (e.g. 1 and 2) of a wiring plane is first that the circuit designer can separately access the different wiring forms stored under the different layer types in different data formats and display them on the screen for example in different colors. The different wiring forms separated by the different data formats or layer types can thus also be automatically manipulated and checked in an adequate but different manner.

Figure 3:
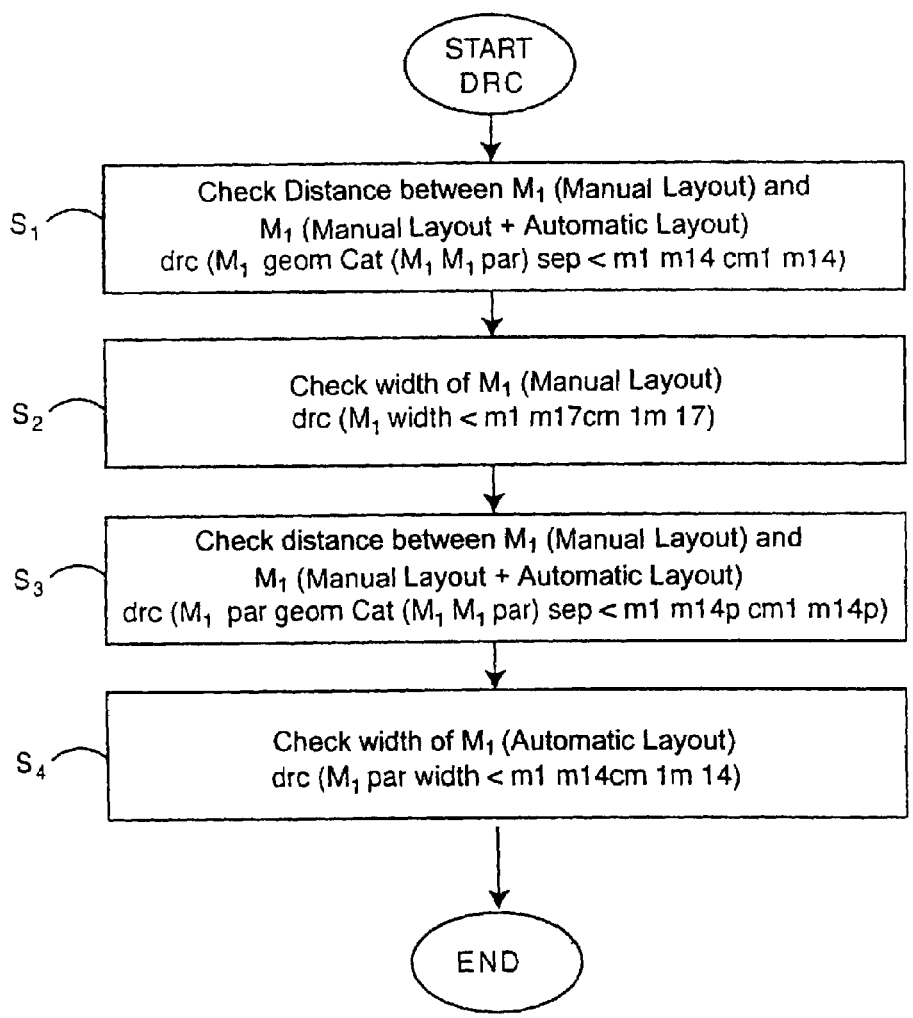
FIG. 3 is a flow diagram for implementing the method according to the invention using a design rule check.

FIG. 3 specifies, in the form of a flow diagram, an implementation of the method according to the invention in a design rule check (DRC). DRC is an abbreviation of design rule check and results in an automatic checking of the technological specifications for the physical chip design by software.

After the start of the program illustrated in FIG. 3, in step S1, a distance between M1 (manual layout) and M1 (manual layout+automatic layout) is checked. In step S2, the width of M1 (manual layout) is checked. Afterward, in step S3, the distance between M1 (automatic layout) and M1 (manual layout+automatic layout) is checked. Afterward, step S4 checks the width of M1 (automatic layout).

It shall be noted here that the implementation of the method according to the invention in manufacturing OPC is completely analogous to the example specified in the flow diagram of FIG. 3.

The above description makes it clear that, according to the invention, different wiring forms of a respective metallization plane are drawn on a respectively different layer type. Thus, the wide-range wiring, which represents a first wiring form, is drawn (and stored) on a layer of a different type than the short-range wiring, which represents a second wiring form. In this way, the possibility of automatically distinguishing the two wiring forms from one another and treating them differently is created for layout checks (design rule checks) and automatic layout manipulations.

We claim:

1. A method for fabricating an integrated semiconductor circuit having at least two different wiring forms realized in a same metallization plane, which comprises the steps of:
    assigning a respectively different layer type in a layout representation to each of the different wiring forms, when carrying out graphical layout design;
    distinguishing the two different wiring forms as a short-range wiring form and a wide-range wiring form that can be automatically identified in the layout representation as the respectively different layer types, the wide-range wiring form substantially containing wirings for signal and supply lines for a plurality of function blocks, and the short-range wiring form substantially containing wirings of individual components within a function block;
    illustrating in the layout representation the wide-range wiring form using an automatic wiring tool; and
    illustrating in the layout representation the short-range wiring form based on a macro level and largely manually.

2. The fabrication method according to claim 1, which comprises:
    assigning a first minor layer type to the wide-range wiring form on the metallization plane; and
    assigning a second minor layer type to the short-range wiring form on the metallization plane in macros.

3. A method for fabricating an integrated semiconductor circuit having at least two different wiring forms realized in a same metallization plane, which comprises the steps of:
    assigning a respectively different layer type in a layout representation to each of the different wiring forms, when carrying out graphical layout design; and
    storing the respectively different layer types in a computer in respectively assigned different data formats.

4. A method for fabricating an integrated semiconductor circuit having at least two different wiring forms realized in a same metallization plane, which comprises the steps of:
    distinguishing the two different wiring forms as a short-range wiring form and a wide-range wiring form that can be automatically identified in a representation thereof, the wide-range wiring form substantially containing wirings for signal and supply lines for a plurality of function blocks, and the short-range wiring form substantially containing wirings of individual components within a function block;
    assigning a respectively different layer type in a layout representation to each of the different wiring forms, when carrying out graphical layout design, by the steps of:
        illustrating the wide-range wiring form using an automatic wiring tool;
        illustrating the short-range wiring form based on a macro level and largely manually; and
    automatically manipulating structures stored as data during a chip design by carrying out a manipulation for the wide-range wiring form and the short-range wiring form with in each case specific values depending on the respectively defined layer types.

5. A method for fabricating an integrated semiconductor circuit having at least two different wiring forms realized in a same metallization plane, which comprises the steps of:
    distinguishing the two different wiring forms as a short-range wiring form and a wide-range wiring form that can be automatically identified in a representation thereof, the wide-range wiring form substantially containing wirings for signal and supply lines for a plurality of function blocks, and the short-range wiring form substantially containing wirings of individual components within a function block;
    assigning a respectively different layer type in a layout representation to each of the different wiring forms, when carrying out graphical layout design, by the steps of:
        illustrating in the layout the wide-range wiring form using an automatic wiring tool;
        illustrating in the layout the short-range wiring form based on a macro level and largely manually; and
    automatically checking technological specifications for a physical chip design using software by checking structures stored as data for the short-range wiring form and for the wide-range wiring form with in each case specific values depending on the respectively defined layer types.

* * * * *